(12) United States Patent
Lynn et al.

(10) Patent No.: US 10,636,274 B1
(45) Date of Patent: Apr. 28, 2020

(54) RECONFIGURABLE ENCLOSURE SYSTEM WITH BARRIER CONTINUITY LOOP INTRUSION DETECTION

(71) Applicant: The Boeing Company, Chicago, IL (US)

(72) Inventors: James M. Lynn, Woodinville, WA (US); Gerald Pollard, Snohomish, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/237,925

(22) Filed: Jan. 2, 2019

(51) Int. Cl.
| | | |
|---|---|---|
| *G08B 13/08* | (2006.01) | |
| *G08B 21/18* | (2006.01) | |
| *H03K 5/24* | (2006.01) | |
| *H01R 24/20* | (2011.01) | |
| *H01R 24/28* | (2011.01) | |
| *G08B 7/06* | (2006.01) | |
| *H01R 101/00* | (2006.01) | |
| *H01R 13/62* | (2006.01) | |
| *H01R 13/04* | (2006.01) | |
| *H01R 13/10* | (2006.01) | |

(52) U.S. Cl.
CPC ............ *G08B 21/185* (2013.01); *G08B 7/06* (2013.01); *H01R 24/20* (2013.01); *H01R 24/28* (2013.01); *H03K 5/24* (2013.01); *H01R 13/04* (2013.01); *H01R 13/10* (2013.01); *H01R 13/6205* (2013.01); *H01R 2101/00* (2013.01)

(58) Field of Classification Search
CPC ..... G08B 13/12; G08B 13/122; G08B 21/185
See application file for complete search history.

(56) References Cited

U.S. PATENT DOCUMENTS

| | | | | | |
|---|---|---|---|---|---|
| 3,609,739 | A | * | 9/1971 | Walter | G08B 13/02 340/550 |
| 3,626,403 | A | * | 12/1971 | Ive | G08B 13/08 340/521 |
| 3,714,644 | A | * | 1/1973 | Hellstrom | E05B 45/005 340/508 |

(Continued)

OTHER PUBLICATIONS

Dyna-Snap Magnetic Wire Connection; https://www.dyna-snap.com; accessed on Sep. 26, 2018.

*Primary Examiner* — Hongmin Fan
(74) *Attorney, Agent, or Firm* — Perman & Green, LLP

(57) ABSTRACT

An enclosure system including barrier segments and at least one electrical cable coupled to each barrier segment. Each electrical cable having electrical connectors disposed at each of a first terminus and a second terminus of the electrical cable. Each electrical connector is releasably coupled to another electrical connector of an adjacent electrical cable to form at least one continuity loop through the barrier segments. Each continuity loop includes two electrical terminal ends disposed at free ends of the continuity loop. A comparator system is coupled to a respective continuity loop and is configured to generate a closed loop signal when electrical current flows to the comparator system from one of the two electrical terminal ends of the respective continuity loop, and an open loop signal when electrical current ceases to flow to the comparator system from the one of the two electrical terminal ends of the respective continuity loop.

20 Claims, 10 Drawing Sheets

(56) References Cited

U.S. PATENT DOCUMENTS

| | | | | |
|---|---|---|---|---|
| 4,015,256 A | * | 3/1977 | Pratt | G08B 25/14 |
| | | | | 340/508 |
| 4,318,088 A | * | 3/1982 | Hunter | G08B 13/122 |
| | | | | 174/158 F |
| 4,334,218 A | * | 6/1982 | Kun | G08B 13/02 |
| | | | | 200/61.47 |
| 4,703,313 A | * | 10/1987 | Husmann | G08B 13/122 |
| | | | | 340/550 |
| 5,568,535 A | * | 10/1996 | Sheffer | B60R 25/102 |
| | | | | 379/39 |
| 6,084,509 A | * | 7/2000 | Simpson, Sr. | G08B 25/008 |
| | | | | 340/506 |

\* cited by examiner

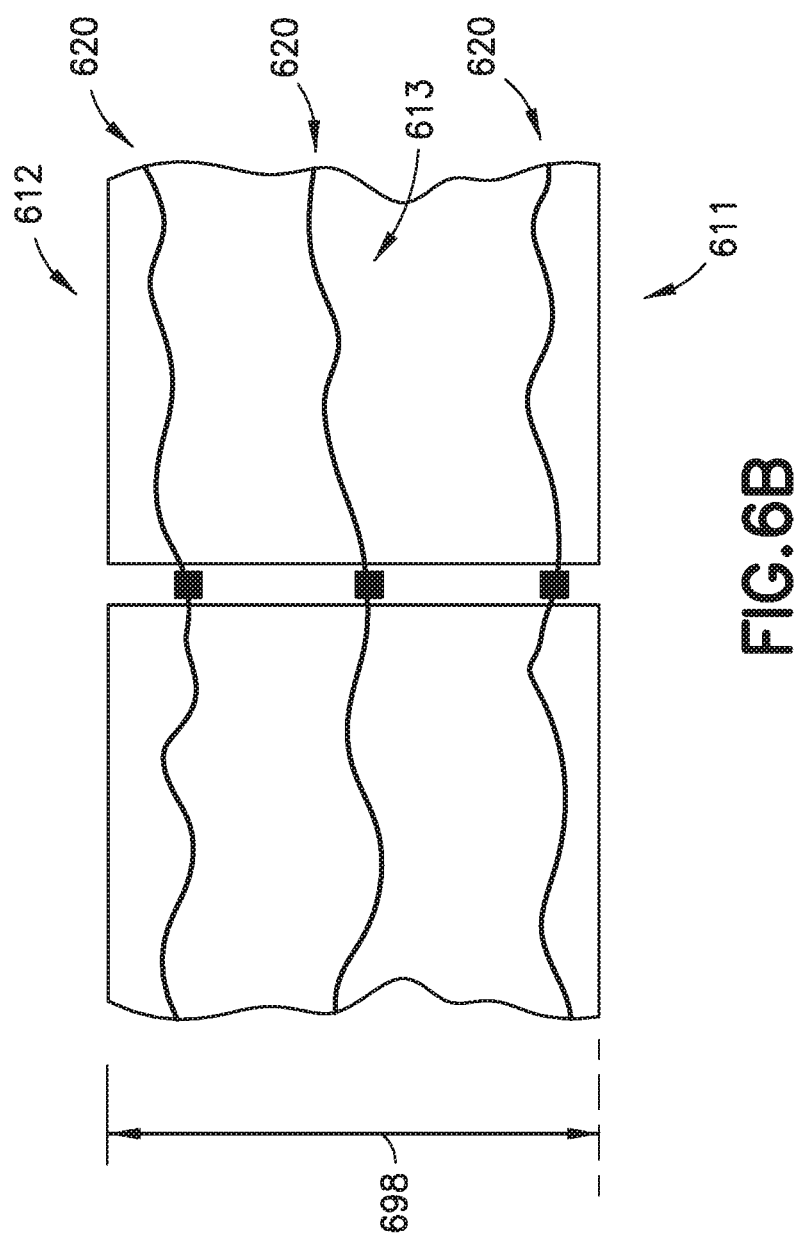

RECONFIGURABLE ENCLOSURE SYSTEM WITH BARRIER CONTINUITY LOOP INTRUSION DETECTION

BACKGROUND

1. Field

The exemplary embodiments generally relate to enclosures and more particularly to reconfigurable enclosures with intrusion detection.

2. Brief Description of Related Developments

Generally, when access to a predetermined enclosed area is to be restricted the predetermined enclosed area is enclosed by a barrier. The barrier in many cases is fencing, railings, portable barricade gates, and/or crowd control stanchions. The restricted access to the predetermined enclosed area may be in a manufacturing environment to prevent individuals or mobile machinery (such as forklifts) from entering the predetermined enclosed area while a manufacturing process is being performed within the predetermined enclosed area. When the manufacturing process is performed at a stationary location the barrier is fixed in place (such as on a factory floor) and does not move. However, when a moving or pulsed assembly line is employed in the manufacturing process, a fixed barrier may not be applicable as the item being manufactured travels throughout the factory. To accommodate the moving item temporary barriers are employed, such as freestanding segments of fencing that are positioned adjacent one another so as to surround the item being manufactured on the moving or pulsed assembly line. However, gaps are present between the adjacent freestanding segments of fencing where the gaps may form a point of entry into the predetermined enclosed area. The adjacent freestanding segments are strapped or buckled to each other to close the gaps and the point of entry.

SUMMARY

Accordingly, apparatuses and methods intended to address, at least, the above-identified concerns would find utility.

The following is a non-exhaustive list of examples, which may or may not be claimed, of the subject matter according to the present disclosure.

One example of the subject matter according to the present disclosure relates to an enclosure system comprising: barrier segments; at least one electrical cable coupled to each barrier segment, each electrical cable having electrical connectors disposed at each of a first terminus and a second terminus of the electrical cable, where each electrical connector is configured to releasably couple to another electrical connector of an adjacent electrical cable so as to form at least one continuity loop through the barrier segments, and each continuity loop includes two electrical terminal ends disposed at free ends of the continuity loop; and a comparator system coupled to a respective continuity loop, the comparator system being configured to generate a closed loop signal when electrical current flows to the comparator system from one of the two electrical terminal ends of the respective continuity loop, and an open loop signal when electrical current ceases to flow to the comparator system from the one of the two electrical terminal ends of the respective continuity loop.

Another example of the subject matter according to the present disclosure relates to a barrier system comprising: a series of electrically coupled cables extending along at least one barrier segment, where adjacent electrical cables of the series of electrically coupled cables are electrically coupled to each other so as to form a continuity loop through the at least one barrier segment; and a comparator system coupled to the continuity loop and being configured to generate one or more or an aural and visual indication representing continuity between the adjacent electrical cables.

Still another example of the subject matter according to the present disclosure relates to a method of alerting an operator of an unauthorized presence in an enclosed area, the method comprising: disconnecting connectors of adjacent electrical cables in a series of electrically coupled cables, the series of electrically coupled cables extending along at least one barrier segment, where adjacent electrical cables are electrically coupled to each other so as to form a continuity loop through the at least one barrier segment; generating an open loop signal with a comparator system coupled to the series of electrically coupled cables, the open loop signal indicating an absence of electrical current in the series of electrically coupled cables based on a comparison, by the comparator system, of voltage at each terminal end of the series of electrically coupled cables; and producing at least one of an aural and visual indication based on the open loop signal.

BRIEF DESCRIPTION OF THE DRAWINGS

Figure 1A:
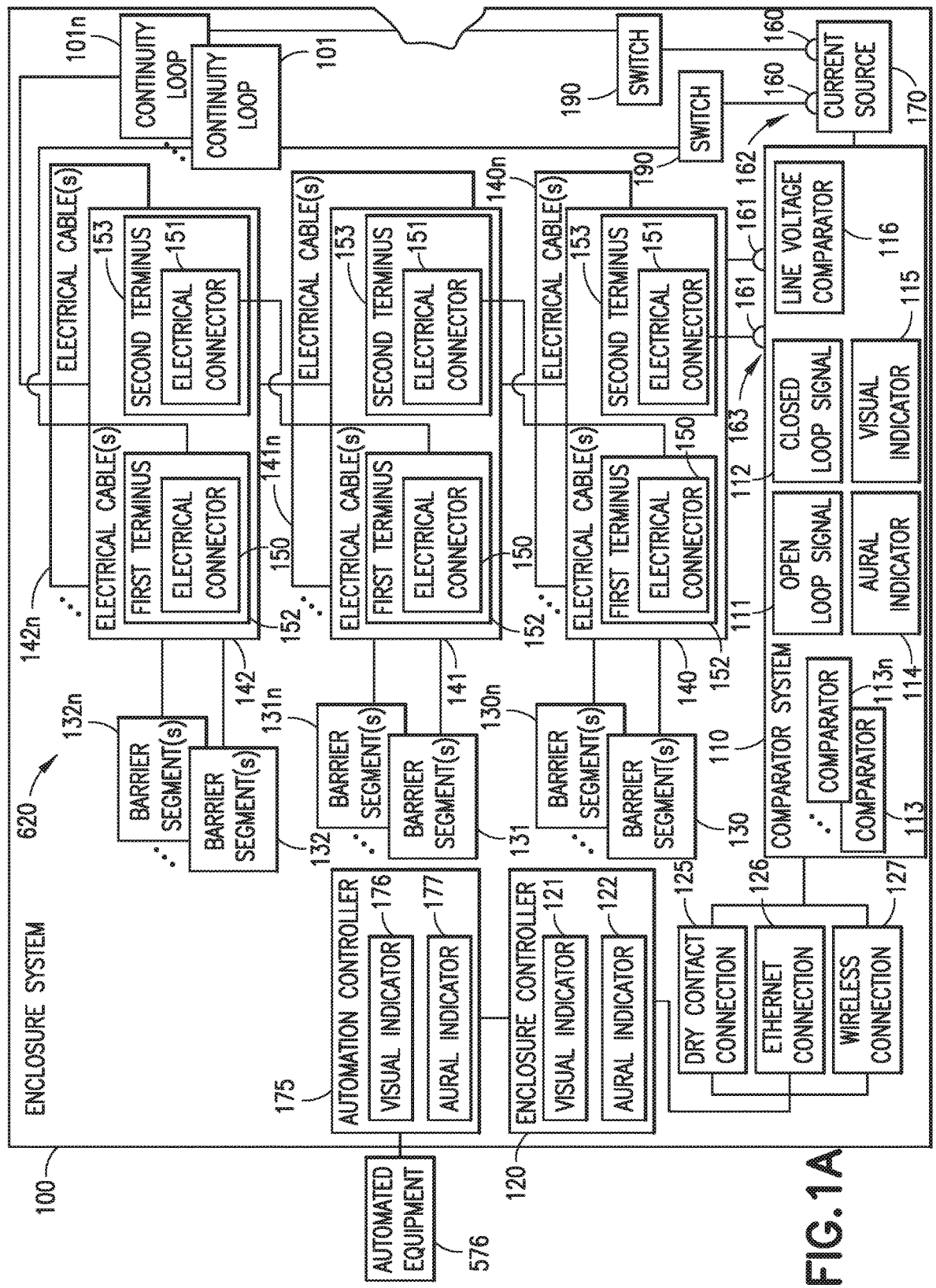
Figure 1B:
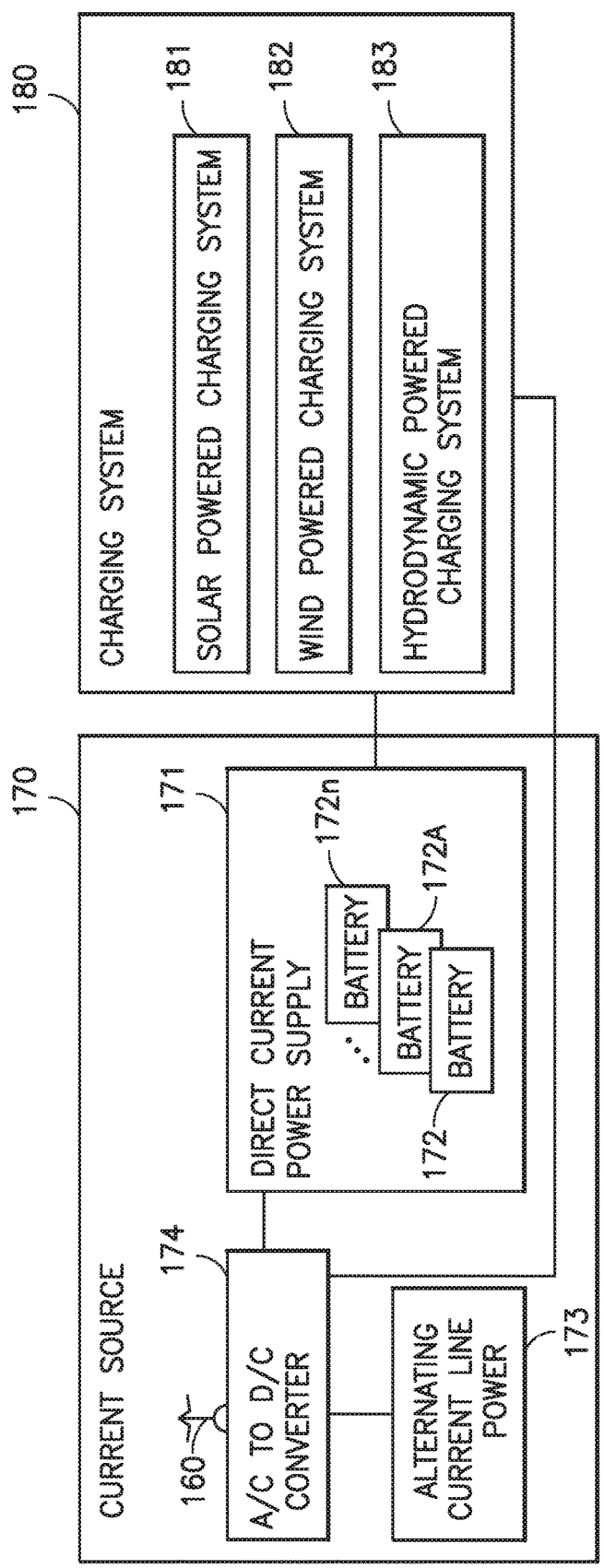
Figure 2:
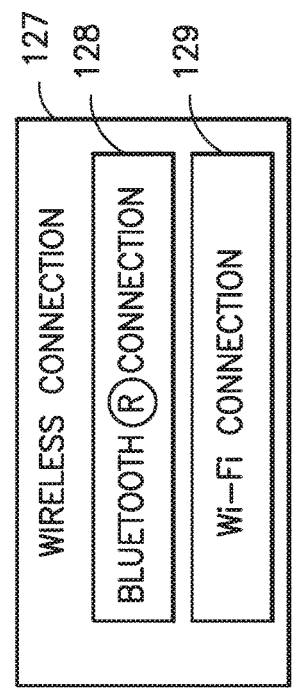
Figure 3:
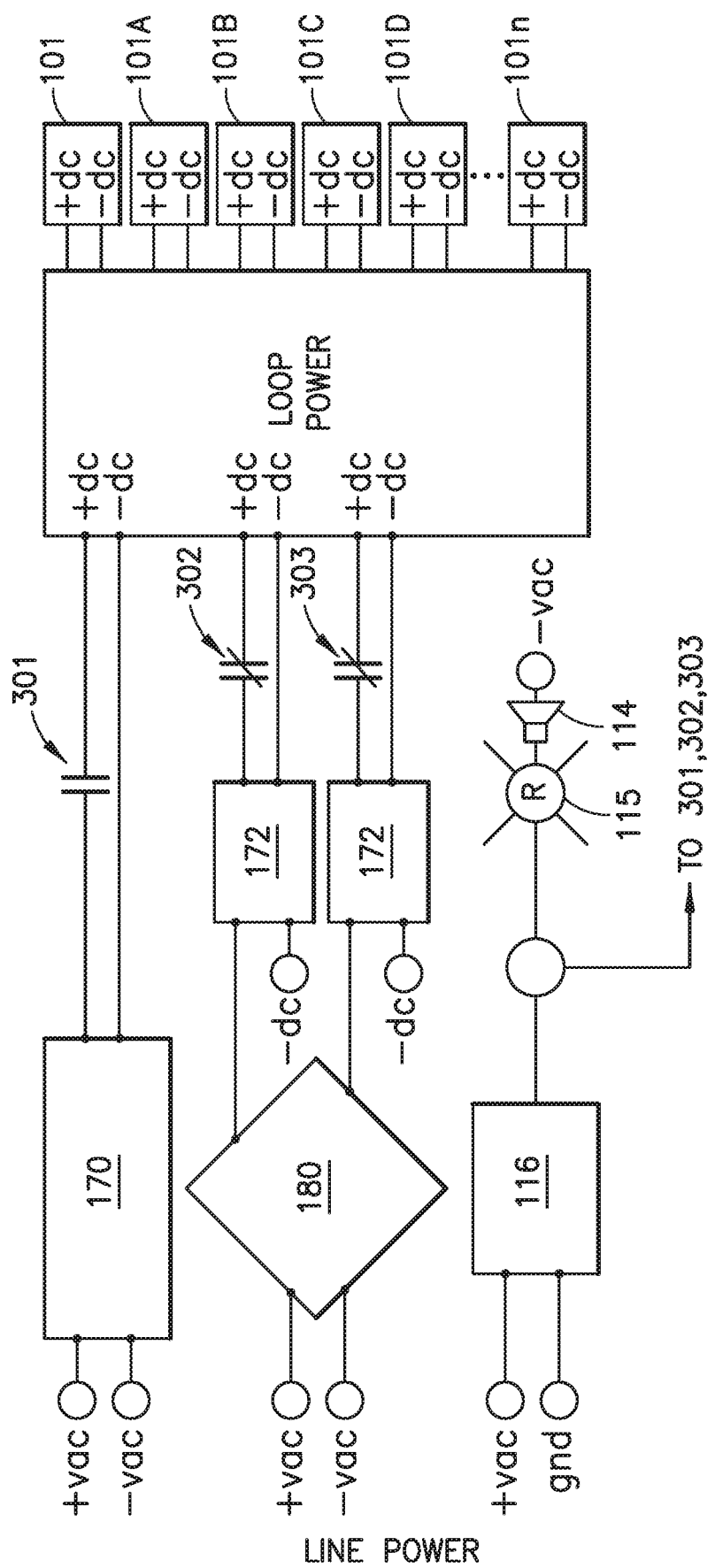
Figure 4:
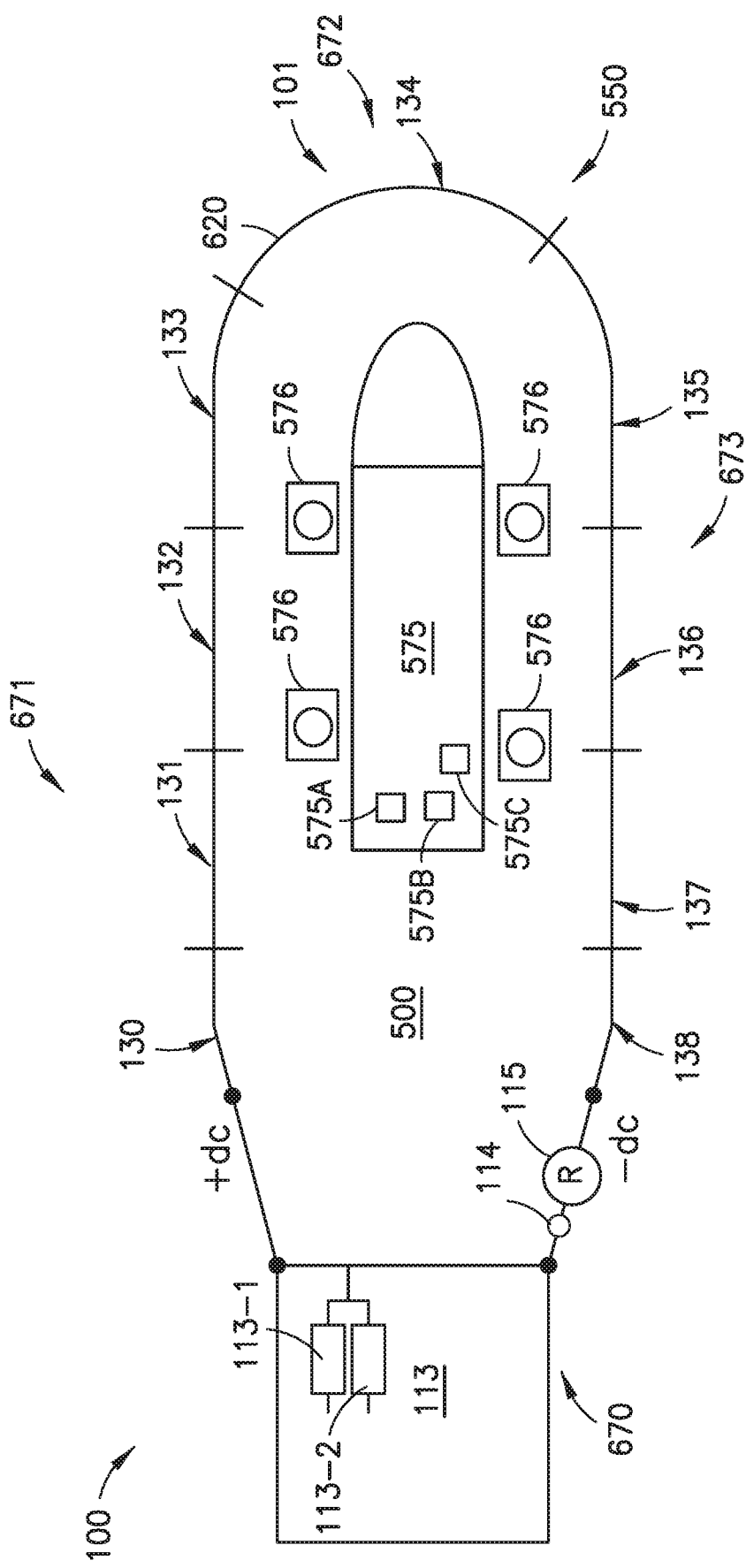
Figure 5:
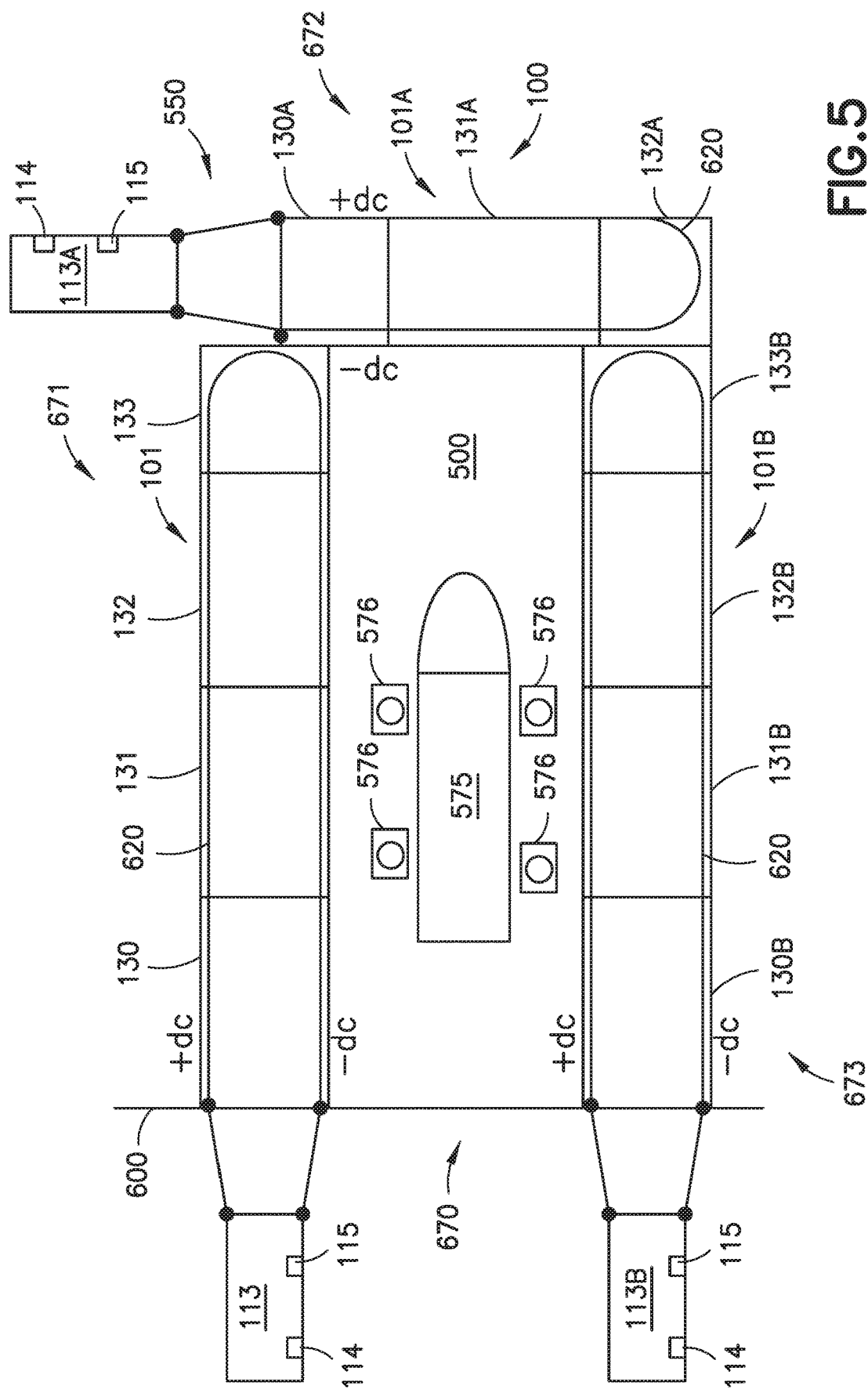
Figure 6A:
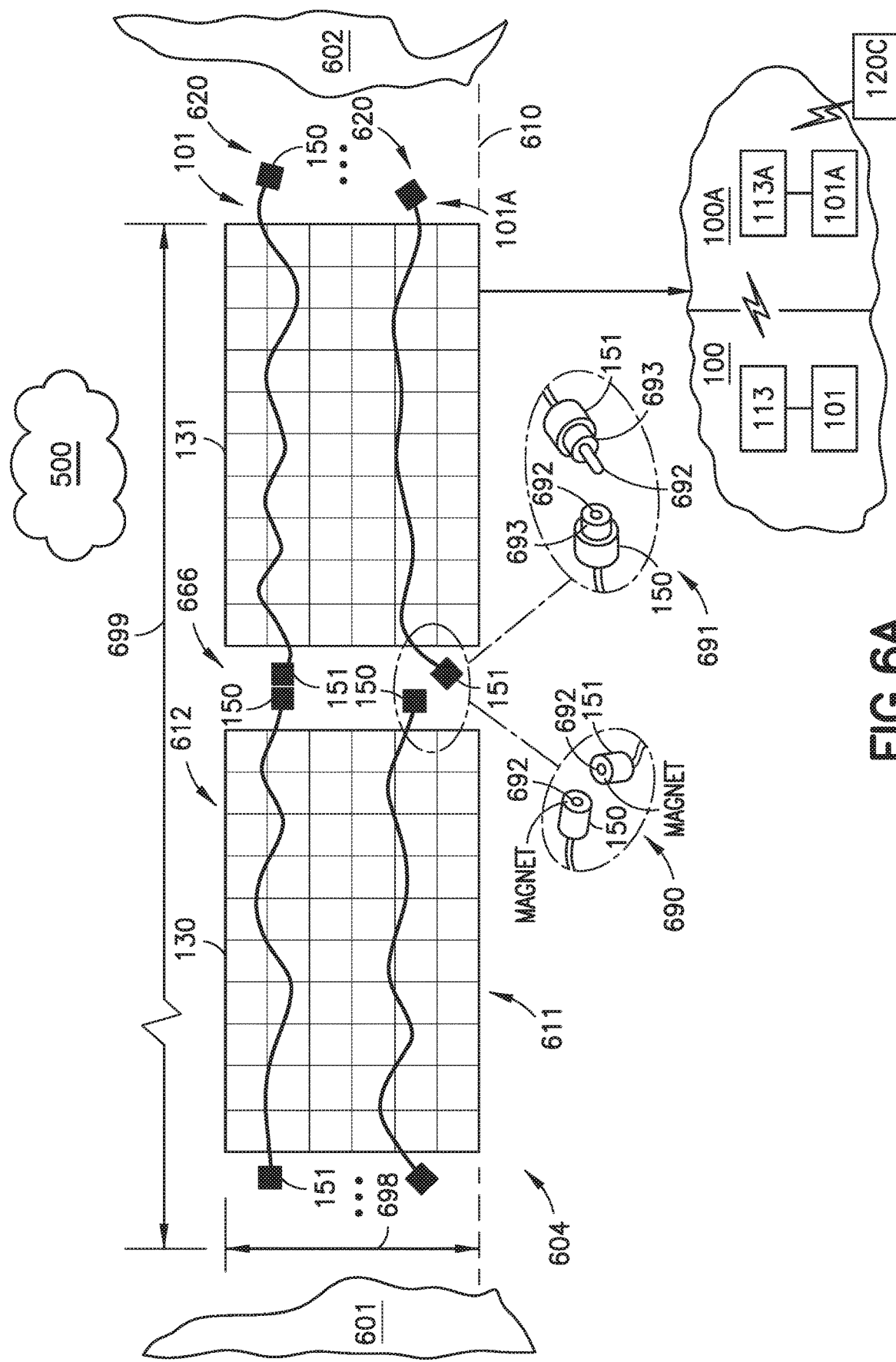
Figure 6C:
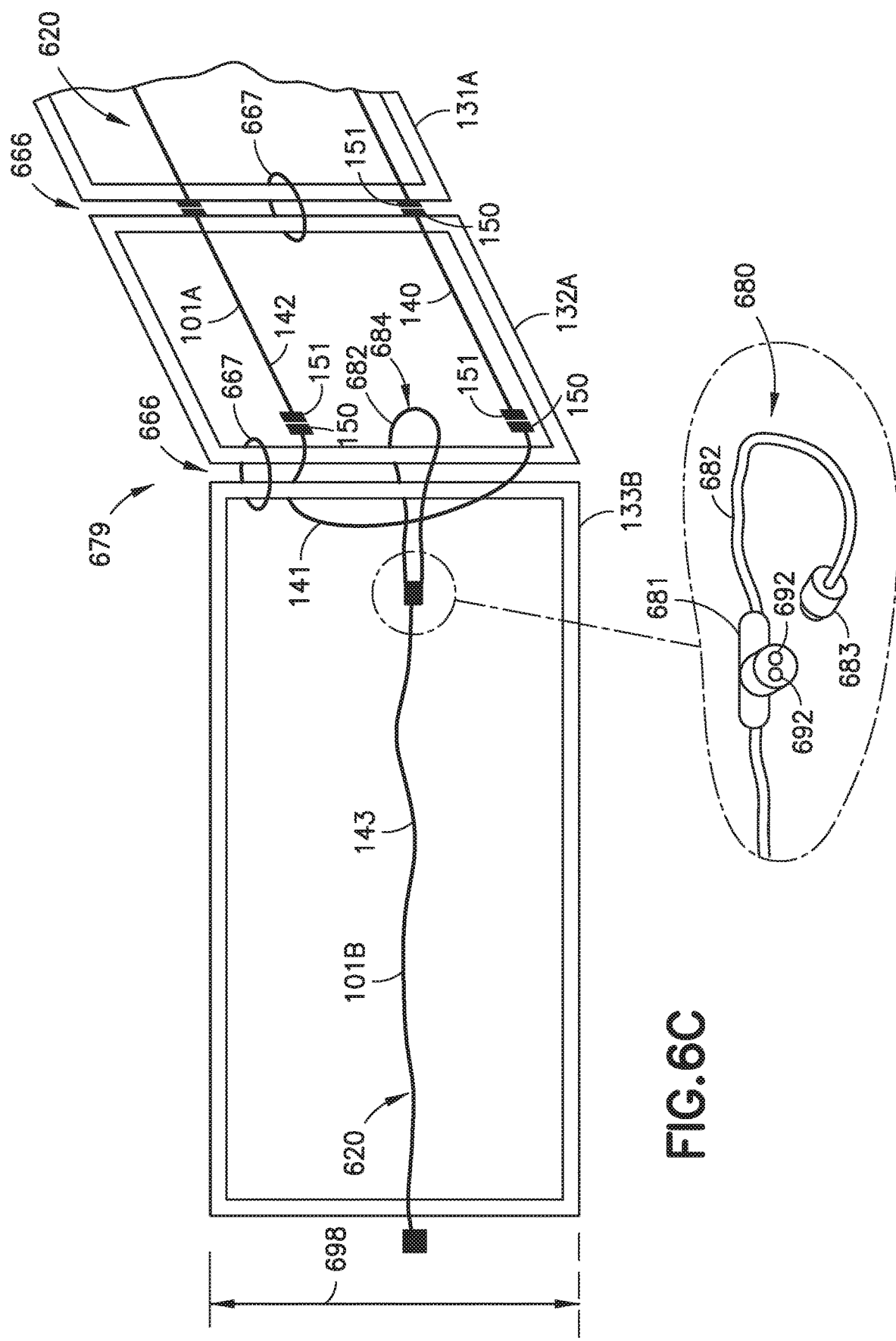
Figure 7:
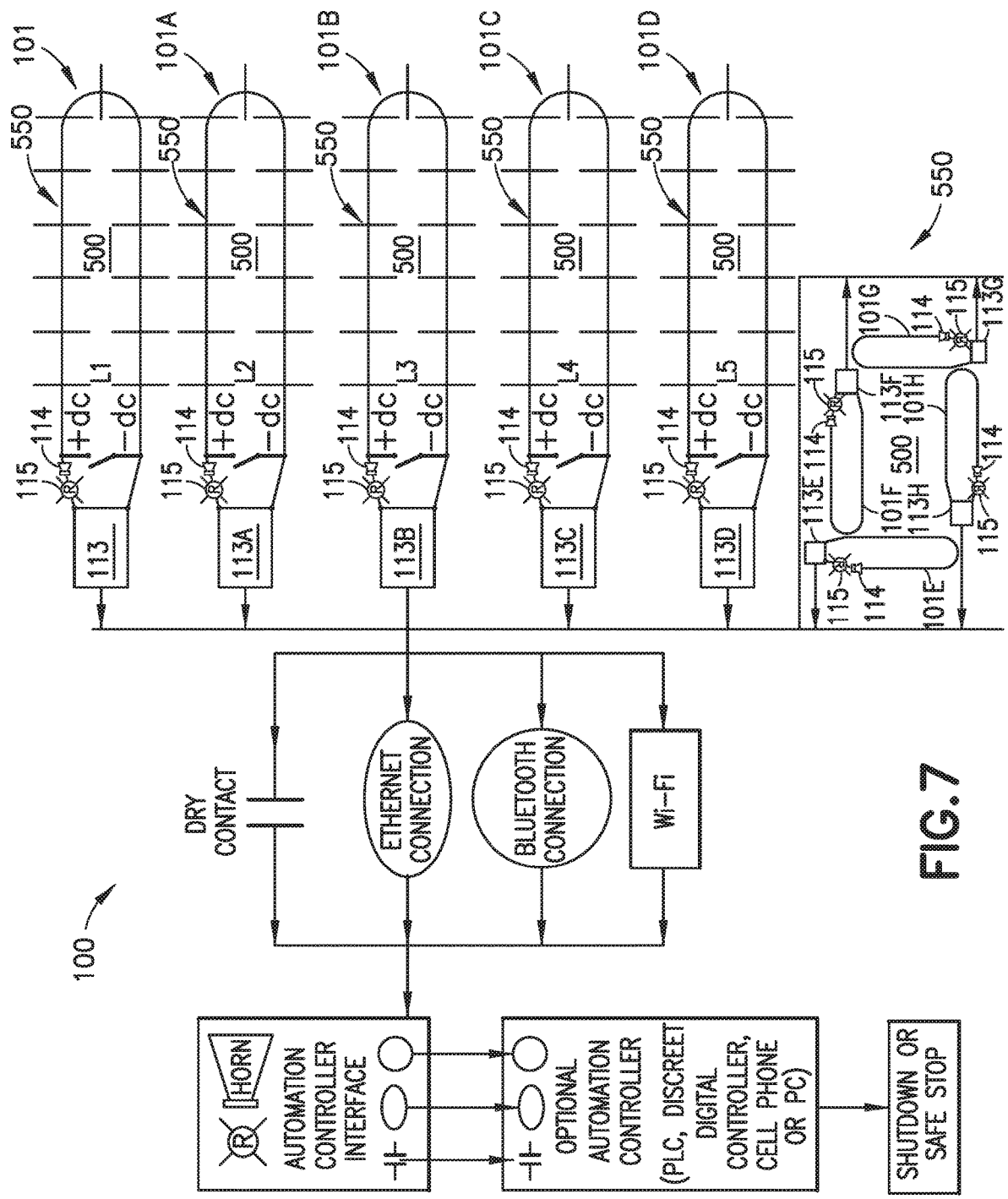
Figure 8:
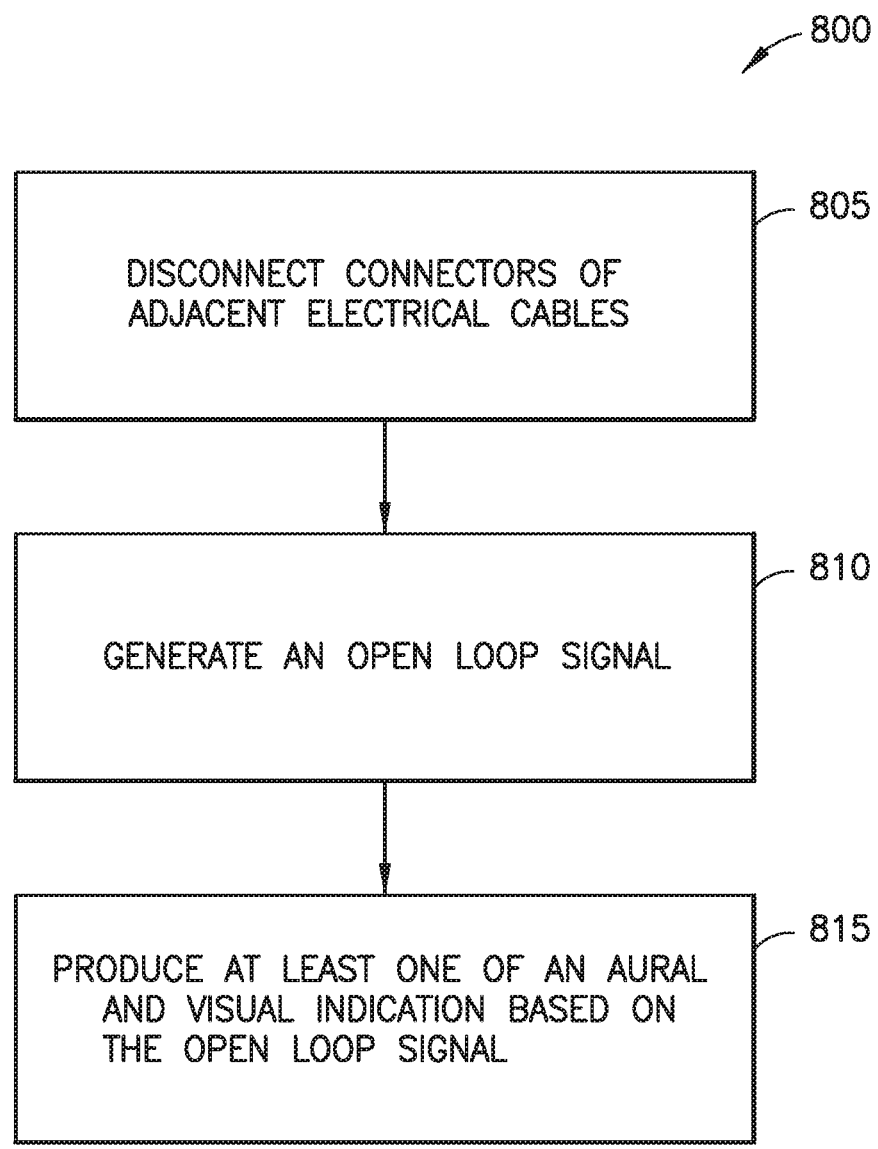

Having thus described examples of the present disclosure in general terms, reference will now be made to the accompanying drawings, which are not necessarily drawn to scale, and wherein like reference characters designate the same or similar parts throughout the several views, and wherein:

FIG. 1A is a schematic block diagram of an enclosure system in accordance with aspects of the present disclosure;

FIG. 1B is a schematic block diagram of a portion of the enclosure system of FIG. 1A in accordance with aspects of the present disclosure;

FIG. 2 is a schematic block diagram of a portion of the enclosure system of FIG. 1A in accordance with aspects of the present disclosure;

FIG. 3 is a schematic illustration of a portion the enclosure system of FIG. 1A in accordance with aspects of the present disclosure;

FIG. 4 is a schematic illustration of a portion of the enclosure system of FIG. 1A in accordance with aspects of the present disclosure;

FIG. 5 is a schematic illustration of a portion of the enclosure system of FIG. 1A in accordance with aspects of the present disclosure;

FIG. 6A is a schematic illustration of barrier segments and electrically coupled cables of the enclosure system of FIG. 1A in accordance with aspects of the present disclosure;

FIG. 6B is a schematic illustration of barrier segments and electrically coupled cables of the enclosure system of FIG. 1A in accordance with aspects of the present disclosure;

FIG. 6C is a schematic illustration of barrier segments and electrically coupled cables of the enclosure system of FIG. 1A in accordance with aspects of the present disclosure;

FIG. 7 is a schematic illustration of the enclosure system of FIG. 1A having multiple enclosures, each of the multiple enclosures having a respective single continuity loop or multiple continuity loops in accordance with aspects of the present disclosure; and FIG. 8 is a block diagram of a method in accordance with aspects of the present disclosure.

DETAILED DESCRIPTION

Referring to FIGS. 1A-1C, the aspects of the present disclosure provide for a reconfigurable enclosure system 100 with continuity loop intrusion/escapement detection. The enclosure system 100 is portable and may form one or more temporary and/or permanent barriers to restrict access into or out of a predetermined enclosed area 500 (see, e.g., FIG. 4) (which predetermined enclosed area 500 in this case may be a parcel of land, an entertainment venue, construction site, portions of a factory, or other suitable location where a temporary barrier is used to create an enclosure that has restricted access). In one aspect, the enclosure system 100 may be configured to completely surround/enclose the predetermined enclosed area (see, e.g., FIGS. 4 and 7) so as to define the predetermined enclosed area. In another aspect, the enclosure system 100 may be configured to partially surround/enclose the predetermined enclosed area (see, e.g., FIG. 5) where a natural barrier (e.g., river, mountain, body of water, etc.) or artificial structure (e.g., wall, building, etc.) extends between ends of the enclosure system 100 to define the predetermined enclosed area 500. In still another aspect, the enclosure system 100 may be in the form of a barrier system 604 (see, e.g., FIG. 6A) that may or may not fully enclose the predetermined enclosed area 500 but forms a barrier to prevent crossing a predetermined boundary 610 (see FIG. 6A) of the predetermined enclosed area 500. For example, the barrier may be disposed between to natural barriers such as mountains 601, 602 (see FIG. 6A) or artificial structures (such as buildings, etc.) to substantially prevent passage between the mountains 601, 602 (or artificial structures) into or out of the predetermined enclosed area 500 (which predetermined enclosed area 500 in this case may be a parcel of land, an entertainment venue, construction site, states/country borders, portions of a factory, or other suitable location where a temporary barrier is used to create an enclosure that has restricted access).

The enclosure system 100 includes intrusion/escapement detection through a comparator system 110 that includes at least one comparator 113 that is/are configured to detect the presence or absence of a low voltage signal (e.g., to detect current from a low voltage source), such as a 24 volt direct current (VDC) voltage signal passing through a respective continuity loop(s) 101. The 24 VDC voltage signal may provide for the use of the enclosure system 100 in any suitable indoor and/or outdoor environment(s) including locations where flammable gases, vapors, and/or liquids are present. The comparator system 110 is configured to output either an open loop signal 111 (indicating a loss of current and possible intrusion into or escapement from the predetermined enclosed area 500) or a closed loop signal 112 (indicating the presence of current and an intact/properly installed barrier) depending on whether the low voltage signal is present or absent. The comparator system 110 is configured to discriminate between a voltage signal of zero VDC and any voltage greater than zero VDC so that a length 699 (see FIG. 6A) of a single continuity loop 101 of the enclosure system 100 may, in one aspect, span distances greater than about one mile (about 1.6 kilometers), and in other aspects may span distances between about three miles (about 4.8 kilometers) and about five miles (about 8 kilometers). The operational length of the enclosure system 100 may be facilitated by having substantially no load in the continuity loop(s) 101 and a high impedance input to at least one comparator(s) 113-113n of the comparator system 110.

The enclosure system 100 includes one or more of a visual indicator 115, 121 and an aural indicator 114, 122 that provide an indication of current flow receipt at the at least one comparator 113-113n. For example, the visual indicator 115, 121 and/or the aural indicator 114, 122 is/are activated when, for example, one of the comparators 113-113n outputs the open loop signal 111 indicating a loss of current flow receipt at the one of the comparators 113-113n. The visual indicator 115, 121 may be any suitable light, strobe, or other suitable visual cue that notifies an operator (such as a factory worker, ranch hand, border patrol, security guard, police, etc.) of a break in continuity of at least one of the continuity loops 101 and of potential intrusion into or escapement from the predetermined enclosed area 500. The aural indicator 114, 122 may be any suitable siren, horn, or other suitable audible cue that notifies an operator (such as a factory worker, ranch hand, border patrol, security guard, police, etc.) of a break in continuity of at least one of the continuity loops 101 and of potential intrusion into or escapement from the predetermined enclosed area 500.

Still referring to FIGS. 1A-1C, the enclosure system 100 (which may be in the form of the barrier system 604 spanning between two natural or artificial features/structures—see FIG. 6A) includes one or more barrier segment(s) 130, 131, 132 (three barrier segments are illustrated in each continuity loop 101-101n of FIG. 1A for exemplary purposes only and in other aspects there may be more or less than three barrier segments in each continuity loop 101-101n) and at least one electrical cable 140, 141, 142 (three electrical cables are illustrated in each continuity loop 101-101n of FIG. 1A for exemplary purposes only and in other aspects there may be more or less than three electrical cables in each continuity loop 101-101n) coupled to each respective barrier segment 130, 131, 132. For example, at least one electrical cable 140 extends along barrier segment 130; at least one electrical cable 141 extends along barrier segment 131; and at least one electrical cable 142 extends along barrier segment 132. Each electrical cable 140, 141, 142 has electrical connectors 150, 151 disposed at each of a first terminus 152 and a second terminus 153 of the electrical cable 140, 141, 142. Each electrical connector 150, 151 is configured to releasably couple to another electrical connector 150, 151 of an adjacent electrical cable 140, 141, 142 so as to form a series of electrically coupled cables 620 (see also FIG. 6A). The electrical connectors 150, 151 may be any suitable releasable connectors (e.g., that substantially instantaneously decouple/pull apart without damaging mating electrical connectors) such as, for example, magnetically coupled connectors 690 (FIG. 6A including at least one conductor 692 and magnets to couple terminal ends, and the respective conductors, of two electrical cables together) or RCA type connectors 691 (FIG. 6A) that have one or more conductors 692, 693 therein. The one or more conductors 692, 693 may be 18 gauge conductors; while in other aspects the one or more conductors may be larger or smaller than 18 gauge. The series of electrically coupled cables 620 are electrically coupled to each other so as to form at least one continuity loop 101 through the barrier segments 130, 131, 132 (as described herein a single barrier segment may have more than one continuity loop at different elevations of the single barrier segment). While three barrier segments are illustrated in FIG. 1A for exemplary purposes only, the series of electrically coupled cables 620 may extend through at least one barrier segment 130, 131, 132.

As illustrated in FIG. 1A, more than one continuity loop 101-101n (see also FIG. 3) may be formed by respective electrical cables 140-140n, 141-141n, 142-142n extending through respective barrier segments 130-130n, 131-131n, 132-132n. In one aspect, two or more of the continuity loops may be disposed on a common (i.e., same) side of an enclosure 550 (see FIGS. 4, 5, and 7) formed by the barrier segments 130-130n, 131-131n, 132-132n. In another aspect two or more of the continuity loops may be disposed on different sides of the enclosure 550 formed by the barrier segments 130-130n, 131-131n, 132-132n (e.g., each side 670-673 of the enclosure 550 has a respective continuity loop(s) 101-101n). Each continuity loop 101-101n includes two electrical terminal ends 160, 161 disposed at free ends 162, 163 of the continuity loop 101-101n. The free ends 162, 163 of the continuity loop are not coupled to an adjacent electrical cable. For example, one of the electrical terminal ends 160 may be coupled to a current/voltage source (referred to herein as current source 170) such as the 24 VDC source. The other of the electrical terminal ends 161 may be coupled to a respective comparator 113-113n of the comparator system 110 so that the comparator system 110 is coupled to a respective continuity loop 101-101n. In one aspect, each of the continuity loops 101-101n is coupled to at least two comparators 113-1, 113-2 (FIG. 4) that are common to a respective one of the at least one continuity loop 101-101n, where the at least two comparators 113-1, 113-2 are coupled to the respective one of the at least one continuity loop 101-101n in parallel with each other to provide at least primary and secondary comparators. The comparator system 110 (through the comparators 113-113n thereof) is configured in any suitable manner to generate the closed loop signal 112 when electrical current flows to the comparator system 110 from one of the two electrical terminal ends (in FIG. 1A electrical current flows from terminal end 161 but in other aspects the terminal end positions may be reversed so that terminal end 161 is coupled to the current source 170 and terminal end 160 is coupled to the comparator system 110) of the respective continuity loop 101-101n. The comparator system 110 (through the comparators 113-113n thereof) is also configured in any suitable manner to generate the open loop signal 111 when the electrical current ceases to flow to the comparator system 110 from the one of the two electrical terminal ends 160, 161 of the respective continuity loop 101-101n. The comparators 113-113n may include any suitable circuitry configured to, in one aspect, compare an output voltage from the current source 170 to a respective continuity loop 101-101n and an input voltage to the respective comparator 113-113n from the respective continuity loop 101-101n, where if any voltage is not detected coming from the respective continuity loop 101-101n the comparator senses/determines an absence of current flow in the respective continuity loop 101-101n In one aspect, the comparator system 110 is configured to generate one or more of an aural and visual indication representing continuity between the adjacent electrical cables 140, 141, 142. For example, the comparator system 110 includes one or more of an aural indicator 114 (such as described above) and a visual indicator 115 (such as described above) that is activated (or not activated) when the comparator system 110 detects current (e.g., through the voltage comparison between the terminal ends 160, 161 of a respective continuity circuit 101-101n) and generates the closed loop signal 112. For example actuation of the aural indicator 114 (such as described above) and/or visual indicator 115 may provide an indication to an operator of the enclosure system 100 that the enclosure formed by the barrier segments 130, 131, 132 is secured and manufacturing may begin within the enclosure. If the aural indicator 114 (such as described above) and/or visual indicator 115 is not actuated that is an indication to the operator that the enclosure is not secured and that there has been unauthorized access or the barrier has not been installed properly. In one aspect, each of the at least one continuity loop 101-101n includes a switch 190 configured to couple and decouple the respective continuity loop 101-101n from the current source 170, such as to allow the operator to set-up or otherwise reconfigure the enclosure system 100 without activating the aural indicator 114 and/or visual indicator 115.

Referring to FIGS. 1A and 1B, the current source 170, in the example shown in FIG. 1A being coupled to terminal end 160, is configured to supply the electrical current/voltage to at least the respective continuity loop 101-101n. The current source 170 comprises a direct current power supply 171 that has at least one battery 172-172n. In one aspect, a charging system 180 is coupled to the direct current power supply 171 and is configured to charge the at least one battery 172-172n. The charging system 180 may operate from alternating current line power 173 such as where the enclosure system 100 is located within a factory building or any other location where alternating current line power is available. In other aspects the charging system 180 may be any suitable charging system for charging the at least one battery 172-172n in any suitable environment. For example the charging system 180 may include one or more of a solar powered charging system 181, a wind powered charging system 183, and a hydrodynamic powered charging system 183 for charging the at least one battery 172-172n (or for providing primary power, in lieu of the alternating current line power 173 in remote environments where the alternating current line power 173 is not available). In one aspect, the at least one battery 172-172n is hot swappable (e.g., one battery can be swapped with another battery without disconnecting electrical power to the enclosure system 100 and/or electrical power to the at least one battery 172-172n). The current source 170 comprises an alternating (A/C) current to direct current (D/C) convertor 174 that converts alternating current line power 173 to direct current power for operation of the enclosure system 100. In one aspect, the A/C to D/C convertor 174 converts power from the charging system 180 for operation of the enclosure system 100, where the charging system 180 is the primary source of power of the enclosure system 100, such as in the remote environment (with the at least one battery operating as a power backup). In one aspect, the charging system 180 may include an A/C to D/C convertor for direct connection to the direct current power supply 171.

Referring to FIGS. 1A, 1B, and 3, the direct current power supply 171, through the at least one battery 172-172n, is configured to provide the electrical current to the at least one continuity loop 101-101n when the alternating current line power 173 is unavailable. The comparator system 110 includes a line voltage comparator 116 that is configured to indicate a loss of the alternating current line power 173. Upon a loss of the alternating current line power 173, the line voltage comparator 116 is configured to switch the current source from the alternating current line power 173 to the at least one battery 172-172n in any suitable manner. For example, the line voltage comparator 116 causes, in any suitable manner, actuation of one or more relays 301-303 (FIG. 3) to disconnect the alternating current line power 173 from the at least one continuity loop 101-101n and to connect the at least one battery 172-172n to the at least one continuity loop 101-101*n*. Conversely, the line voltage comparator is configured to switch the current source from the at least one battery 172-172*n* to the alternating current line power 173 upon detection of the alternating current line power, such as by actuating the one or more relays 301-303 to disconnect the at least one battery 172-172*n* from the at least one continuity loop 101-101*n* and to connect the alternating current line power 173 to the at least one continuity loop 101-101*n*.

As described above, the comparator system 110 comprises at least one comparator 113-113*n*. In one aspect, the comparator system 110 includes at least one comparator 113-113*n* for each of the at least one respective continuity loop 101-101*n*; while in other aspects, two continuity loops may share the same or common comparator(s). In accordance with aspects of the present disclosure two or more adjacent enclosure systems 100, 100A may be communicably coupled so that, e.g., the comparator 113 of enclosure system 100 (FIG. 6A) sends or relays either the open loop signal 111 or the closed loop signal 112 (which may be in the form of binary signals) to the comparator 113A of the adjacent enclosure system 100A (FIGS. 3 and 6A). The comparator 113A may in turn relay the open loop signal 111 or the closed loop signal 112 received from the comparator 101 as well as the open loop signal 111 or the closed loop signal 112 from comparator 113A to a common enclosure controller 120C (substantially similar to enclosure controller 120 in FIG. 1A—also referred to as a barrier controller where the enclosure system is configured as barrier system 604 (see FIG. 6A)) that may be common to the two or more adjacent enclosure systems 100, 100A, and which provides the indication of intrusion or escapement (as described herein) through the two or more communicably coupled enclosure systems 100, 100A. In other aspects, the adjacent enclosure system 100A may include any suitable programming/circuitry to account for an operation status of the enclosure system 100 while only sending a single open or closed loop signal to the common enclosure controller 120C. For example, the comparator 113A may include any suitable processing to recognize the open loop signal 111 or the closed loop signal 112 from comparator 113. Where the comparator 113A receives the closed loop signal 112 from the comparator 113, and there is no intrusion or escapement through the enclosure system 100A, the comparator 113A relays only the closed loop signal 112 from the comparator 113A to the common enclosure controller 120C. Where the comparator 113A receives the open loop signal 112 from the comparator 113, and there is no intrusion or escapement through the enclosure system 100A, the comparator 113A relays only the open loop signal 111 from the comparator 113 to the common enclosure controller 120C. Where the comparator 113A receives the closed loop signal 112 from the comparator 113, and there is an intrusion or escapement through the enclosure system 100A, the comparator 113A relays only the open loop signal 111 from the comparator 113A to the common enclosure controller 120C. Where the comparator 113A receives the open loop signal 111 from the comparator 113, and there is an intrusion or escapement through the enclosure system 100A, the comparator 113A relays only the open loop signal 111 from the comparator 113A to the common enclosure controller 120C. In this relayed manner, a combined enclosure system may be extended to lengths greater than the about five miles (about 8 kilometers) noted above. In addition to the open or closed loop signals, the common enclosure controller 120C may also receive from the adjacent enclosure systems 100, 100A an indication of which of the enclosure systems 100, 100A is indicating the intrusion or escapement to facilitate an expedited response to the intrusion or escapement to a predetermined area of the combined enclosure systems 100, 100A.

While the enclosure system 100 may be operated based on the aural indicator 114 and/or visual indicator 115 of the comparator system 110 alone, the comparator system 110 may be local to the predetermined enclosed area 500 and may not provide for remote observation of the aural indicator 114 and/or visual indicator 115. For example, referring to FIGS. 1A and 4, 5, and 7 the enclosure system 100 is illustrated in FIG. 4 as a single continuity loop 101 system that defines the predetermined enclosed area 500. FIG. 5 illustrates the enclosure system 100 as a multiple continuity loop 101-101B system where the multiple continuity loops 101-101B together with an artificial structure (e.g., wall 600) define the predetermined enclosed area 500. FIG. 7 illustrates the enclosure system 100 defining multiple predetermined enclosed areas 500 with a combination of single continuity loops 101-101D and multiple continuity loops 101E-101H. In FIGS. 4, 5, and 7 each of the continuity loops 101-101H has a respective comparator 113A-113H that actuates a respective aural indicator 114 and/or visual indicator 115. In this aspect, disposing the aural indicators 114 and/or visual indicators 115 at or adjacent the respective continuity loop 101-101H provides the operator with an indication of which continuity loop 101-101H needs attention when one of the comparators 113-113H senses a loss of current flow from the respective continuity loop 101-101H. However, one or more continuity loops 101-101H may be located out of view from the operator. In this aspect, the enclosure system 100 includes an enclosure controller 120 that may provide for centralized and/or mobile monitoring of the continuity loops 101-101H.

Still referring to FIGS. 1A, 1C, 4, 5, and 7, the comparator 113-113H for each of the at least one respective continuity loop 101-101H is communicably coupled to the enclosure controller 120 in any suitable manner. For example, the comparator 113-113H for each of the at least one respective continuity loop 101-101H is communicably coupled to the enclosure controller through one or more of a dry contact connection 125, an Ethernet connection 126 (or other suitable wired connection), and a wireless connection 127. The wireless connection 127 may be a Bluetooth® connection 128, a Wi-Fi connection 129, or any other suitable wireless connection (e.g., satellite, cellular, etc.). The enclosure controller 120 includes one or more of an aural indicator 122 and visual indicator 121 configured to indicate a break in continuity of each of the at least one respective continuity loop 101-101H in a manner substantially similar to that described above with respect to aural indicator 114 and visual indicator 115. In one aspect, where the enclosure controller 120 provides for centralized monitoring of the continuity loops 101-101H the enclosure controller may include any suitable stationary device (e.g., desktop computer, dedicated user interface, etc.) configured to receive signals from the comparators 113-113H and to activate (or de-activate) the aural indicator 122 and/or visual indicator 121 coupled to the stationary device (e.g., the stationary device may include an enclosure system monitoring program that schematically illustrates the continuity loops 101-101H and provides the indication as to the continuity of the respective continuity loops 101-101H based on the closed loop signals 112 and open loop signals 111 generated by the comparators 113-113H). Where the enclosure controller 120 provides mobile monitoring of the continuity loops 101-101H the enclosure controller may comprise a mobile/ cellular phone, a tablet computer, or other suitable mobile device, where the aural indicator 122 and/or visual indicator 121 are incorporated into a user interface of the mobile device (e.g., the mobile device may include an enclosure system monitoring application that schematically illustrates the continuity loops 101-101H and provides the indication as to the continuity of the respective continuity loops 101-101H based on the closed loop signals 112 and open loop signals 111 generated by the comparators 113-113H). In one aspect, the enclosure controller includes a memory or is coupled to a supervisory system which records the locations, dates and/or times (e.g., frequency) of any enclosure 550 intrusions or escapements.

Referring again to FIGS. 1A, 4, 5, and 7 the enclosure system 100 is illustrated in FIG. 4 as a single continuity loop 101 system that defines the predetermined enclosed area 500. The plurality of barrier segments 130-138 are serially arranged so as to form sides 670-673 of an enclosure 550, where the continuity loop 101 extends along two or more sides 670-673. For example, the barrier segments 130-138 are serially disposed relative to each other to form at least two sides of the enclosure system 100. In one aspect, the barrier segments 130-138 of at least one of the at least two sides of the enclosure system comprises at least two continuity loops 101, 101A vertically spaced apart from one another on the barrier segments 130-138 as described herein. A series of electrically coupled cables 620 extends along the serially disposed barrier segments 130-138 to form the continuity loop 101 (noting that barrier segments 130-138 are coupled to each other to enclose the predetermined enclosed area 500 but are illustrated schematically as being separated for purposes of comparator 113 and continuity loop 101 illustration). The barrier segments 130-138 of the present disclosure are serially arranged relative to one another so as to define barrier segment interfaces 666 and adjacent electrical cables of the series of electrically coupled cables 620 are electrically coupled to each other at respective barrier segment interfaces 666 (See FIGS. 6A and 6C). In one aspect, there may be more than one continuity loop 101 disposed on the barrier segments 130-138. For example, each continuity loop 101 may be spaced disposed at different elevations (e.g., vertically spaced) relative to each along a height 698 of at least one of the barrier segments 130-138 other so that one series of electrically coupled cables 620 is disposed adjacent a bottom 611 of the barrier segments 130-138 and another series of electrically coupled cables 620 is disposed adjacent a top 612 of the barrier segments 130-138 in a manner similar to that illustrated in FIG. 6A. In still other aspects, more than two series of electrically coupled cables 620 may be spaced vertically relative to each other along the height 698 such as at the top 612, the bottom 611 and the middle 613 of the barrier segments 130-138 in a manner similar to that illustrated in FIG. 6B. In this aspect, one or more of the barrier segments 130-138 comprises at least a portion of two continuity loops 101, 101A spaced apart from one another on the barrier segments 130-138.

FIG. 5 illustrates the enclosure system 100 as a multiple continuity loop 101-101B system where the multiple continuity loops 101-101B together with an artificial structure (e.g., wall 600) form the enclosure 550 and define the predetermined enclosed area 500. In other aspects, another continuity loop may disposed in place of the wall 600 so that the continuity loops form an entire perimeter (enclosure 550) entirely surrounding the predetermined enclosed area 500 (as illustrated in FIG. 7). In this aspect, the wall 600 defines a respective side 670 of the predetermined enclosed area 500, barrier segments 130-133 define a respective side 671 of the predetermined enclosed area 500, barrier segments 130A-132A define a respective side 672 of the predetermined enclosed area 500, and barrier segments 130B-133B define a respective side 673 of the predetermined enclosed area 500. Each side 671-673 of the enclosure system 100 formed by the barrier segments 130-133, 130A-132A, 130B-133B in FIG. 5 (and all sides in aspects where the wall is replaced with barrier segments—see FIG. 7) includes at least one respective continuity loop 101-101B. For example, barrier segments 130-133 have a respective series of electrically coupled cables 620 extending along the barrier segments 130-133 to form continuity loop 101. Barrier segments 130A-132A have a respective series of electrically coupled cables 620 extending along the barrier segments 130A-132A to form continuity loop 101A. Barrier segments 130B-133B have a respective series of electrically coupled cables 620 extending along the barrier segments 130B-133B to form continuity loop 101B.

Referring also to FIG. 6C, where adjacent sides 671-673 of the predetermined enclosed area 500 intersect or meet, the barrier segments (such as barrier segments 132A, 133B—FIG. 6C) may form a corner 679 of the predetermined enclosed area 500. To provide for detection of intrusion or escapement at corners, such as the corner 679, where the adjacent sides 671-673 intersect or meet a portion of the electrical cable(s) 140-142 that form the respective continuity loops 101-101B may be common to more than one side 671-673 of the predetermined enclosed area 500. For example, continuity loop 101A may be formed of a series of electrically coupled cables 620 having at least one conductor 692 in each electrical cable of the series of electrically coupled cables 620 (FIG. 6A). In this aspect, one or more of the electrical cables 141 of continuity loop 101A may extend from barrier segment 132A so as to wrap around a portion of barrier segment 133B belonging to continuity loop 101B. As such, a portion of a respective continuity loop 101A for a respective side 672 is common to both the respective side 672 and the adjacent side 673. The electrical cable(s) 141 may couple to adjacent electrical cables 140, 142 such that the electrical connectors 150, 151 of adjacent electrical cables are disposed adjacent a barrier segment interface 666 between adjacent barrier segments 133B, 132A where the adjacent barrier segments may be coupled to each other with one or more coupling members 667 (e.g., straps, belts, ties, etc.). In this aspect, the series of electrically coupled cables 620 of continuity loop 101A are disposed at different elevations (e.g., adjacent the top and adjacent the bottom) of at least one of the barrier segments 130A-132A.

Still referring to FIGS. 5 and 6C, in another aspect, continuity loop 101B may be formed of a series of electrically coupled cables 620 having at least two conductors 692 (FIG. 6C) in each electrical cable of the series of electrically coupled cables 620 so that a single cable includes corresponding opposite sides of the respective continuity loop 101-101n (e.g., current in one conductor within the electrical cable flows in one direction and current in the other conductor within the cable flow in the opposite direction, where the direction is changed by a looped end 680). At least one electrical cable 143 of the series of electrically coupled cables 620 of continuity loop 101B includes a looped end 680 formed by a an inline T-coupling 681, a cable extension 682 extending from the inline T-coupling 681, and an electrical connector 683 which when coupled to the inline T-coupling 681 forms a loop 684. In this aspect, the cable extension 682 is wrapped around portions of both barrier segments 132A, 133B so that a portion of a respective continuity loop 101B for the respective side 673 is common to both the respective side 673 and the adjacent side 672. Additional series of electrically coupled cables 620 having at least two conductors 692 may be disposed at different elevations, each forming a respective continuity loop in a manner similar to that shown in FIGS. 6A and 6B.

FIG. 7 illustrates the enclosure system 100 defining multiple predetermined enclosed areas 500 with a combination of single continuity loops 101-101D and multiple continuity loops 101E-101H. In FIG. 7 the enclosure 550 formed by the respective single continuity loops 101-101D are each substantially similar to the continuity loop 101 described with respect to one or more of FIGS. 4, 6A, and 6B. The enclosure 550 formed by the multiple continuity loops 101E-101H is substantially similar to enclosure described above with respect to one or more of FIGS. 5, 6A, 6B, and 6C.

Referring to FIGS. 1A, 4, and 5, the enclosure system 100 may be employed to provide an enclosure 550 around a manufacturing area (such as for vehicle 575 which may be an aircraft 575A, an automobile 575B, a marine vessel 575C, etc.) that includes automated equipment 576 such as automated assembly robots or other automated machines. In this aspect, the enclosure system 100 includes an automation controller 175 that is communicably coupled to the enclosure controller 120 in any suitable manner, such as through a wired or wireless coupling (e.g., such as those described herein). In one aspect the automation controller 175 may be part of the enclosure controller 120; while in other aspects, the enclosure controller 120 may be part of the automation controller 175. The automation controller 175 is communicably coupled to the automated equipment 576 (e.g., through wired or wireless couplings such as those described herein) and is configured to command shutdown of the automated equipment 576 when the comparator system 110 generates the open loop signal 111. For example, when one of the comparators 113-113n of the enclosure system detects a loss of current flow from a respective continuity loop 101n, the comparator system 110, through the one of the comparators 113-113n generates the open loop signal 111 and sends the open loop signal 111 to the enclosure controller 120 and the automation controller 175. Upon receipt of the open loop signal 111 the automation controller 175 issues suitable commands to the automated equipment 576 for the shutdown of the automated equipment 576. In this aspect, in the event of an intrusion into (or an escapement from) the predetermined enclosed area 500 the automated equipment 576 is shut down substantially immediately upon entry of the intruder. The automation controller 175 may also include one or more of a visual indicator 176 and an aural indicator 177 (similar to those described herein) and is configured to generate one or more of an aural and visual indication when the comparator system 110 generates the open loop signal 111 to alert an operator of the enclosure system of a potential intrusion into (or escapement from) the predetermined enclosed area 500.

Referring to FIGS. 1A and 8 and exemplary method 800 of alerting an operator of an unauthorized presence in an enclosed area will be described in accordance with the aspects of the present disclosure. The method 800 includes disconnecting electrical connectors 150, 151 of adjacent electrical cables 140-142 (FIG. 8, Block 805) in a series of electrically coupled cables 620, where the series of electrically coupled cables 620 extends along at least one barrier segment 130-132, and where adjacent electrical cables 140-142 are electrically coupled to each other so as to form a continuity loop 101 through the at least one barrier segment 130-132. The electrical connectors 150, 151 may be disconnected when something or someone attempts to enter the enclosure 550 (see FIGS. 4, 5, and 7), formed by the barrier segments 130-132, by passing through the barrier segment interfaces 666 (see FIGS. 6A and 6C) and/or by climbing over the barrier segments 130-132. When the electrical connectors 150, 151 become disconnected current from the current source 170 stops flowing through the continuity loop 101. This stop in the flow of current is detected or sensed by the comparator 113. Upon detection of the absence of current flow, the comparator system 110, through the comparator 113, generates the open loop signal 111 (FIG. 8, Block 810) where the open loop signal indicates the absence of electrical current in the series of electrically coupled cables 620 based on a comparison, by the comparator system 110 (e.g., through the comparator 113), of voltage at each terminal end 160, 161 of the series of electrically coupled cables 620. The absence of electrical current in the series of electrically coupled cables 620 may indicate attempted intrusion or intrusion into (or an attempted escapement or an escapement from) the predetermined enclosed area 500 (FIGS. 4, 5, and 7). Otherwise, when the comparator system 110, through the comparator 113, detect the flow of current the comparator system 110 generates, through the comparator 113, the closed loop signal 112 indicating a presence of the electrical current in the series of electrically coupled cables 620 based on a comparison, by the comparator system 110, of voltage at each terminal end 160, 161 of the series of electrically coupled cables 620. At least one of an aural and visual indication of the closed loop signal 112 may be produced as described herein to indicate to an operator that the enclosure 550 is secured and installed properly. The automation controller 175, where provided, may command shutdown of the automated equipment 576 when the comparator system 110 generates the open loop signal 111. At least one of an aural and visual indication is produced based on the open loop signal (FIG. 8, Block 815) as described herein.

Prior to disconnection of the electrical connectors 150, 151, the predetermined enclosed area 500 is formed by serially arranging a plurality of barrier segments 130-132 relative to one another so as to define barrier segment interfaces 666 (FIGS. 6A and 6C), where the adjacent electrical cables 140-142 are electrically coupled to each other at respective barrier segment interfaces 666. Sides 670-673 (FIGS. 4, 5, and 7) of the predetermined enclosed area 500 are formed with the plurality of barrier segments 130-132, wherein, in one aspect, each side 670-673 has a respective continuity loop 101-101n and the comparator system 110 includes respective comparator 113-113n for each respective continuity loop 101-101n. Electrical current is supplied by the current source 170 to the continuity loop(s) 101-101n where the comparator system 110 is coupled to one terminal end 161 of the continuity loop(s) 101-101n and the current source 170 is coupled to another terminal 160 end of the continuity loop(s) 101-101n. The comparator system 110 may be coupled to the current source 170 to effect a comparison between voltages at the terminal ends 160, 161 so that the comparator 113-113n can detect the absence or presence of current flow in the respective continuity loop 101-101n.

The following are provided in accordance with the aspects of the present disclosure:

A1. An enclosure system comprising:
barrier segments;
at least one electrical cable coupled to each barrier segment, each electrical cable having electrical connectors disposed at each of a first terminus and a second terminus of the electrical cable, where
each electrical connector is configured to releasably couple to another electrical connector of an adjacent electrical cable so as to form at least one continuity loop through the barrier segments, and
each continuity loop includes two electrical terminal ends disposed at free ends of the continuity loop; and
a comparator system coupled to a respective continuity loop, the comparator system being configured to generate
a closed loop signal when electrical current flows to the comparator system from one of the two electrical terminal ends of the respective continuity loop, and
an open loop signal when electrical current ceases to flow to the comparator system from the one of the two electrical terminal ends of the respective continuity loop.

A2. The enclosure system of paragraph A1, further comprising a current source coupled to another one of the two electrical terminal ends of the respective continuity loop, the current source being configured to supply the electrical current to at least the respective continuity loop.

A3. The enclosure system of paragraph A2, wherein the current source comprises a direct current power supply.

A4. The enclosure system of paragraph A3, wherein the direct current power supply comprises at least one battery.

A5. The enclosure system of paragraph A4, further comprising a charging system configured to charge the at least one battery.

A6. The enclosure system of paragraph A5, wherein the charging system is one or more of a solar powered charging system, a wind powered charging system, and a hydrodynamic powered charging system.

A7. The enclosure system of paragraph A4, wherein the at least one battery is hot swappable.

A8. The enclosure system of paragraph A2, wherein the current source comprises an alternating current to direct current convertor that converts alternating current line power to direct current power.

A9. The enclosure system of paragraph A8, wherein the current source comprises at least one battery configured to provide the electrical current when the alternating current line power is unavailable.

A10. The enclosure system of paragraph A9, wherein the comparator system includes a line voltage comparator configured to indicate a loss of the alternating current line power.

A11. The enclosure system of paragraph A9, wherein the comparator system includes a line voltage comparator configured to switch the current source from the alternating current line power to the at least one battery upon loss of the alternating current line power.

A12. The enclosure system of paragraph A11, wherein the line voltage comparator is configured to switch the current source from the at least one battery to the alternating current line power upon detection of the alternating current line power.

A13. The enclosure system of paragraph A2, wherein the respective continuity loop includes a switch configured to couple and decouple the respective continuity loop from the current source.

A14. The enclosure system of paragraph A1, wherein the comparator system comprises a comparator and one or more of an aural indicator and a visual indicator, the one or more of an aural indicator and a visual indicator is configured to provide an indication of current flow receipt at the comparator.

A15. The enclosure system of paragraph A1, wherein the free ends of the continuity loop are not coupled to an adjacent electrical cable.

A16. The enclosure system of paragraph A1, wherein:
the barrier segments are serially disposed relative to each other to form at least two sides of the enclosure system; and
each side of the enclosure system includes at least one respective continuity loop.

A17. The enclosure system of paragraph A16, wherein the comparator system includes a comparator for each of the at least one respective continuity loop.

A18. The enclosure system of paragraph A17, wherein the comparator for each of the at least one respective continuity loop is communicably coupled to an enclosure controller, the enclosure controller includes one or more of an aural indicator and visual indicator configured to indicate a break in continuity of each of the at least one respective continuity loop.

A19. The enclosure system of paragraph A17, wherein the comparator for each of the at least one respective continuity loop is communicably coupled to an enclosure controller through one or more of a dry contact connection, an Ethernet connection, and a wireless connection.

A20. The enclosure system of paragraph A19, wherein the wireless connection comprises one or more of a Bluetooth® connection and a Wi-Fi connection.

A21. The enclosure system of paragraph A16, wherein the barrier segments of at least one of the at least two sides of the enclosure system comprises at least two continuity loops spaced apart from one another on the barrier segments.

A22. The enclosure system of paragraph A1, wherein the comparator system includes a comparator for each of the at least one continuity loop.

A23. The enclosure system of paragraph A1, wherein the comparator system is communicably coupled to an enclosure controller, the enclosure controller includes one or more of an aural indicator and visual indicator configured to indicate a break in continuity of each of the at least one continuity loop when the comparator system generates the open loop signal.

A24. The enclosure system of paragraph A23, wherein the comparator system is communicably coupled to the enclosure controller through one or more of a dry contact connection, an Ethernet connection, and a wireless connection.

A25. The enclosure system of paragraph A24, wherein the wireless connection comprises one or more of a Bluetooth® connection and a Wi-Fi connection.

A26. The enclosure system of paragraph A1, wherein one or more of the barrier segments comprises at least a portion of two continuity loops spaced apart from one another on the barrier segments.

A27. The enclosure system of paragraph A1, wherein the comparator system is communicably coupled to an automation controller, the automation controller being configured to command shutdown of automated equipment when the comparator system generates the open loop signal.

A28. The enclosure system of paragraph A27, wherein the automation controller is configured to generate one or more of an aural and visual indication when the comparator system generates the open loop signal.

A29. The enclosure system of paragraph A1, wherein the comparator system comprises at least two comparators that are common to a respective one of the at least one continuity loop, the at least two comparators being coupled to the respective one of the at least one continuity loop in parallel with each other.

B1. A barrier system comprising:
a series of electrically coupled cables extending along at least one barrier segment, where adjacent electrical cables of the series of electrically coupled cables are electrically coupled to each other so as to form a continuity loop through the at least one barrier segment; and
a comparator system coupled to the continuity loop and being configured to generate one or more or an aural and visual indication representing continuity between the adjacent electrical cables.

B2. The barrier system of paragraph B1, wherein the comparator system is configured to generate
a closed loop signal when electrical current is detected by the comparator system at a terminal end of a respective continuity loop, and
an open loop signal when an absence of electrical current is detected by the comparator system at the terminal end of the respective continuity loop.

B3. The barrier system of paragraph B1, wherein the at least one barrier segment comprises a plurality of barrier segments serially arranged relative to one another so as to define barrier segment interfaces and the adjacent electrical cables are electrically coupled to each other at respective barrier segment interfaces.

B4. The barrier system of paragraph B3, wherein the plurality of barrier segments are serially arranged so as to form sides of an enclosure, each side having a respective continuity loop and the comparator system includes respective comparator for each respective continuity loop.

B5. The barrier system of paragraph B3, wherein a portion of a respective continuity loop for a respective side is common to both the respective side and an adjacent side.

B6. The barrier system of paragraph B3, wherein the plurality of barrier segments are serially arranged so as to form sides of an enclosure, where the continuity loop extends along two or more sides.

B7. The barrier system of paragraph B1, wherein the series of electrically coupled cables are disposed at different elevations of the at least one barrier.

B8. The barrier system of paragraph B1, wherein the comparator system comprises a comparator and one or more of an aural indicator and a visual indicator, the one or more of an aural indicator and a visual indicator is configured to provide an indication of current flow receipt at the comparator.

B9. The barrier system of paragraph B1, wherein each continuity loop comprises free ends, the free ends forming a terminus of the continuity loop that is not coupled to an adjacent electrical cable of the series of electrically coupled cables.

B10. The barrier system of paragraph B1, wherein the comparator system is communicably coupled to a barrier controller, the barrier controller includes one or more of an aural indicator and visual indicator configured to indicate a break in continuity of the continuity loop.

B11. The barrier system of paragraph B10, wherein the comparator system is communicably coupled to the barrier controller through one or more of a dry contact connection, an Ethernet connection, and a wireless connection.

B12. The barrier system of paragraph B11, wherein the wireless connection comprises one or more of a Bluetooth® connection and a Wi-Fi connection.

B13. The barrier system of paragraph B10, wherein the barrier controller is configured to indicate the break in continuity of the continuity loop when the comparator system generates an open loop signal.

B14. The barrier system of paragraph B1, wherein the comparator system is communicably coupled to an automation controller, the automation controller being configured to command shutdown of automated equipment when the comparator system generates an open loop signal.

B15. The barrier system of paragraph B14, wherein the automation controller is configured to generate one or more of an aural and visual indication when the comparator system generates the open loop signal.

B16. The barrier system of paragraph B1, further comprising a current source, wherein the comparator system is coupled to one terminal end of the continuity loop and the current source is coupled to another terminal end of the continuity loop, the current source being configured to supply electrical current to the continuity loop.

B17. The barrier system of paragraph B16, wherein the current source comprises a direct current power supply.

B18. The barrier system of paragraph B17, wherein the direct current power supply comprises at least one battery.

B19. The barrier system of paragraph B18, further comprising a charging system configured to charge the at least one battery.

B20. The barrier system of paragraph B19, wherein the charging system is one or more of a solar powered charging system, a wind powered charging system, and a hydrodynamic powered charging system.

B21. The barrier system of paragraph B18, wherein the at least one battery is hot swappable.

B22. The barrier system of paragraph B16, wherein the current source comprises an alternating current to direct current convertor that converts alternating current line power to direct current power.

B23. The barrier system of paragraph B22, wherein the current source comprises at least one battery configured to provide the electrical current when the alternating current line power is unavailable.

B24. The barrier system of paragraph B23, wherein the comparator system includes a line voltage comparator configured to indicate a loss of the alternating current line power.

B25. The barrier system of paragraph B23, wherein the comparator system includes a line voltage comparator configured to switch the current source from the alternating current line power to the at least one battery upon loss of the alternating current line power.

B26. The barrier system of paragraph B25, wherein the line voltage comparator is configured to switch the current source from the at least one battery to the alternating current line power upon detection of the alternating current line power.

B27. The barrier system of paragraph B16, wherein the continuity loop includes a switch configured to couple and decouple the continuity loop from the current source.

B28. The barrier system of paragraph B1, wherein the comparator system comprises at least two comparators for the continuity loop, the at least two comparators being coupled to the continuity loop in parallel with each other.

C1. A method of alerting an operator of an unauthorized presence in an enclosed area, the method comprising:
disconnecting electrical connectors of adjacent electrical cables in a series of electrically coupled cables, the series of electrically coupled cables extending along at least one barrier segment, where adjacent electrical cables are electrically coupled to each other so as to form a continuity loop through the at least one barrier segment;

generating an open loop signal with a comparator system coupled to the series of electrically coupled cables, the open loop signal indicating an absence of electrical current in the series of electrically coupled cables based on a comparison, by the comparator system, of voltage at each terminal end of the series of electrically coupled cables; and producing at least one of an aural and visual indication based on the open loop signal.

C2. The method of paragraph C1, further comprising generating a closed loop signal with the comparator system, the closed loop signal indicating a presence of electrical current in the series of electrically coupled cables based on a comparison, by the comparator system, of voltage at each terminal end of the series of electrically coupled cables.

C3. The method of paragraph C2, further comprising producing at least one of an aural and visual indication of the closed loop signal.

C4. The method of paragraph C1, further comprising forming the enclosed area by serially arranging a plurality of barrier segments relative to one another so as to define barrier segment interfaces, where the adjacent electrical cables are electrically coupled to each other at respective barrier segment interfaces.

C5. The method of paragraph C4, further comprising forming sides of the enclosed area with the plurality of barrier segments, wherein each side has a respective continuity loop and the comparator system includes respective comparator for each respective continuity loop.

C6. The method of paragraph C1, wherein producing at least one of an aural and visual alert based on the open loop signal comprising producing the at least one of the aural and the visual alert with a barrier controller coupled to the comparator system.

C7. The method of paragraph C6, further comprising communicably coupling the comparator system to the barrier controller through one or more of a dry contact connection, an Ethernet connection, and a wireless connection.

C8. The method of paragraph C1, further comprising:
communicably coupling the comparator system to an automation controller; and
commanding shutdown of automated equipment, with the automation controller, when the comparator system generates the open loop signal.

C9. The method of paragraph C8, further comprising producing the at least one of the aural and the visual indication, with the automation controller, when the comparator system generates the open loop signal.

C10. The method of paragraph C1, further comprising supplying electrical current, with a current source, to the continuity loop, wherein the comparator system is coupled to one terminal end of the continuity loop and the current source is coupled to another terminal end of the continuity loop.

C11. The method of paragraph C10, further comprising charging a battery of the current source with a charging system.

C12. The method of paragraph C10, further comprising converting an alternating current line power to a direct current with an alternating current to direct current convertor of the current source.

C13. The method of paragraph C12, further comprising providing electrical current with at least one battery of the current source when the alternating current line power is unavailable.

C14. The method of paragraph C13, further comprising indicating a loss of alternating current line power with a line voltage comparator of the comparator system.

C15. The method of paragraph C13, further comprising automatically switching the current source from the alternating current line power to the at least one battery upon loss of the alternating current line power.

C16. The method of paragraph C13, further comprising automatically switching the current source from the at least one battery to the alternating current line power upon detection of the alternating current line power.

In the figures, referred to above, solid lines, if any, connecting various elements and/or components may represent mechanical, electrical, fluid, optical, electromagnetic, wireless and other couplings and/or combinations thereof. As used herein, "coupled" means associated directly as well as indirectly. For example, a member A may be directly associated with a member B, or may be indirectly associated therewith, e.g., via another member C. It will be understood that not all relationships among the various disclosed elements are necessarily represented. Accordingly, couplings other than those depicted in the drawings may also exist. Dashed lines, if any, connecting blocks designating the various elements and/or components represent couplings similar in function and purpose to those represented by solid lines; however, couplings represented by the dashed lines may either be selectively provided or may relate to alternative examples of the present disclosure. Likewise, elements and/or components, if any, represented with dashed lines, indicate alternative examples of the present disclosure. One or more elements shown in solid and/or dashed lines may be omitted from a particular example without departing from the scope of the present disclosure. Environmental elements, if any, are represented with dotted lines. Virtual (imaginary) elements may also be shown for clarity. Those skilled in the art will appreciate that some of the features illustrated in the figures, may be combined in various ways without the need to include other features described in the figures, other drawing figures, and/or the accompanying disclosure, even though such combination or combinations are not explicitly illustrated herein. Similarly, additional features not limited to the examples presented, may be combined with some or all of the features shown and described herein.

In FIG. 8, referred to above, the blocks may represent operations and/or portions thereof and lines connecting the various blocks do not imply any particular order or dependency of the operations or portions thereof. Blocks represented by dashed lines indicate alternative operations and/or portions thereof. Dashed lines, if any, connecting the various blocks represent alternative dependencies of the operations or portions thereof. It will be understood that not all dependencies among the various disclosed operations are necessarily represented. FIG. 8 and the accompanying disclosure describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or substantially simultaneously. Additionally, those skilled in the art will appreciate that not all operations described need be performed.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

Different examples of the apparatus(es) and method(s) disclosed herein include a variety of components, features, and functionalities. It should be understood that the various examples of the apparatus(es) and method(s) disclosed herein may include any of the components, features, and functionalities of any of the other examples of the apparatus (es) and method(s) disclosed herein in any combination, and all of such possibilities are intended to be within the scope of the present disclosure.

Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. An enclosure system comprising:
    barrier segments;
    at least one electrical cable coupled to each barrier segment, each electrical cable having electrical connectors disposed at each of a first terminus and a second terminus of the electrical cable, where
        each electrical connector is configured to releasably couple to another electrical connector of an adjacent electrical cable so as to form at least one continuity loop through the barrier segments, and
        each continuity loop includes two electrical terminal ends disposed at free ends of the continuity loop; and
    a comparator system coupled to a respective continuity loop, the comparator system being configured to generate
        a closed loop signal when electrical current flows to the comparator system from one of the two electrical terminal ends of the respective continuity loop, and
        an open loop signal when electrical current ceases to flow to the comparator system from the one of the two electrical terminal ends of the respective continuity loop.

2. The enclosure system of claim 1, further comprising a current source coupled to another one of the two electrical terminal ends of the respective continuity loop, the current source being configured to supply the electrical current to at least the respective continuity loop.

3. The enclosure system of claim 2, wherein the current source comprises a direct current power supply.

4. The enclosure system of claim 2, wherein the current source comprises an alternating current to direct current convertor that converts alternating current line power to direct current power.

5. The enclosure system of claim 4, wherein the current source comprises at least one battery configured to provide the electrical current when the alternating current line power is unavailable.

6. The enclosure system of claim 5, wherein the comparator system includes a line voltage comparator configured to indicate a loss of the alternating current line power.

7. The enclosure system of claim 1, wherein the comparator system comprises a comparator and one or more of an aural indicator and a visual indicator, the one or more of an aural indicator and a visual indicator is configured to provide an indication of current flow receipt at the comparator.

8. The enclosure system of claim 1, wherein the comparator system includes a comparator for each of the at least one continuity loop.

9. The enclosure system of claim 1, wherein the comparator system is communicably coupled to an enclosure controller, the enclosure controller includes one or more of an aural indicator and visual indicator configured to indicate a break in continuity of each of the at least one continuity loop when the comparator system generates the open loop signal.

10. The enclosure system of claim 1, wherein one or more of the barrier segments comprises at least a portion of two continuity loops spaced apart from one another on the barrier segments.

11. The enclosure system of claim 1, wherein the comparator system is communicably coupled to an automation controller, the automation controller being configured to command shutdown of automated equipment when the comparator system generates the open loop signal.

12. A barrier system comprising:
    a series of electrically coupled cables extending along at least one barrier segment, where adjacent electrical cables of the series of electrically coupled cables are electrically coupled to each other so as to form a continuity loop through the at least one barrier segment; and a comparator system coupled to the continuity loop and being configured to generate one or more or an aural and visual indication representing continuity between the adjacent electrical cables.

13. The barrier system of claim 12, wherein the comparator system is configured to generate a closed loop signal when electrical current is detected by the comparator system at a terminal end of a respective continuity loop, and an open loop signal when an absence of electrical current is detected by the comparator system at the terminal end of the respective continuity loop.

14. The barrier system of claim 12, wherein the at least one barrier segment comprises a plurality of barrier segments serially arranged relative to one another so as to define barrier segment interfaces and the adjacent electrical cables are electrically coupled to each other at respective barrier segment interfaces.

15. The barrier system of claim 14, wherein the plurality of barrier segments are serially arranged so as to form sides of an enclosure, each side having a respective continuity loop and the comparator system includes respective comparator for each respective continuity loop.

16. The barrier system of claim 14, wherein a portion of a respective continuity loop for a respective side is common to both the respective side and an adjacent side.

17. The barrier system of claim 14, wherein the plurality of barrier segments are serially arranged so as to form sides of an enclosure, where the continuity loop extends along two or more sides.

18. A method of alerting an operator of an unauthorized presence in an enclosed area, the method comprising:

disconnecting electrical connectors of adjacent electrical cables in a series of electrically coupled cables, the series of electrically coupled cables extending along at least one barrier segment, where adjacent electrical cables are electrically coupled to each other so as to form a continuity loop through the at least one barrier segment;

generating an open loop signal with a comparator system coupled to the series of electrically coupled cables, the open loop signal indicating an absence of electrical current in the series of electrically coupled cables based on a comparison, by the comparator system, of voltage at each terminal end of the series of electrically coupled cables; and producing at least one of an aural and visual indication based on the open loop signal.

19. The method of claim 18, further comprising generating a closed loop signal with the comparator system, the closed loop signal indicating a presence of electrical current in the series of electrically coupled cables based on a comparison, by the comparator system, of voltage at each terminal end of the series of electrically coupled cables.

20. The method of claim 19, further comprising producing at least one of an aural and visual indication of the closed loop signal.

* * * * *